(12) United States Patent
Chang et al.

(10) Patent No.: US 6,319,809 B1
(45) Date of Patent: Nov. 20, 2001

(54) METHOD TO REDUCE VIA POISON IN LOW-K CU DUAL DAMASCENE BY UV-TREATMENT

(75) Inventors: Weng Chang, Taipei; Lain-Jong Li, Hsin-Chiu; Shwang Ming Jeng; Syun-Ming Jang, both of Hsin-Chu, all of (TW)

(73) Assignee: Taiwan Semiconductor Manfacturing Company, Hsin-chu (TW)

( * ) Notice: Subject to any disclaimer, the term of this patent is extended or adjusted under 35 U.S.C. 154(b) by 0 days.

(21) Appl. No.: 09/614,595

(22) Filed: Jul. 12, 2000

(51) Int. Cl.$^7$ ..................................... H01L 21/44
(52) U.S. Cl. .................. 438/597; 438/605; 438/622; 438/687; 438/707
(58) Field of Search .................. 438/597, 605, 438/618, 622, 623, 628, 629, 672, 675, 687, 707, 795, 761

(56) References Cited

U.S. PATENT DOCUMENTS

| | | | |
|---|---|---|---|
| 5,643,407 | 7/1997 | Chang | 156/644.1 |
| 5,705,232 | 1/1998 | Hwang et al. | 427/512 |
| 5,970,384 | 10/1999 | Yamazaki et al. | 438/795 |
| 6,015,759 | 1/2000 | Khan et al. | 438/707 |
| 6,030,891 | 2/2000 | Tran et al. | 438/623 |
| 6,124,216 * | 9/2000 | Ko et al. | 438/766 |

* cited by examiner

*Primary Examiner*—Charles Bowers
*Assistant Examiner*—Asok Kumar Saricar
(74) *Attorney, Agent, or Firm*—George O. Saile; Stephen B. Ackerman; Sevgin Oktay

(57) ABSTRACT

A method to reduce via poisoning in low-k copper dual damascene interconnects through ultraviolet (UV) irradiation of the damascene structure is disclosed. This is accomplished by irradiating the insulative layers each time the layers are etched to form a portion of the damascene structure. Thus, irradiation is performed once after the forming of a trench or a via, and again for the second time when the insulative layers are etched to form the remaining trench or via. The trench and hole openings of the dual damascene structure are exposed to UV light in a dry ozone environment, which then favorably alters the surface characteristics of the low-k dielectric walls which are normally hydrophobic. Hence, during etching, moisture is not absorbed into the walls. Furthermore, it is found that the UV treatment inhibits reaction between the walls and the photoresist used during the forming of the damascene structure, thereby providing clean openings without any photoresist residue, and hence, much less poisoned contacts/vias. Consequently, as copper is deposited into the clean damascene, voids are avoided, and a Cu dual damascene interconnect with low RC delay characteristics is obtained.

23 Claims, 3 Drawing Sheets

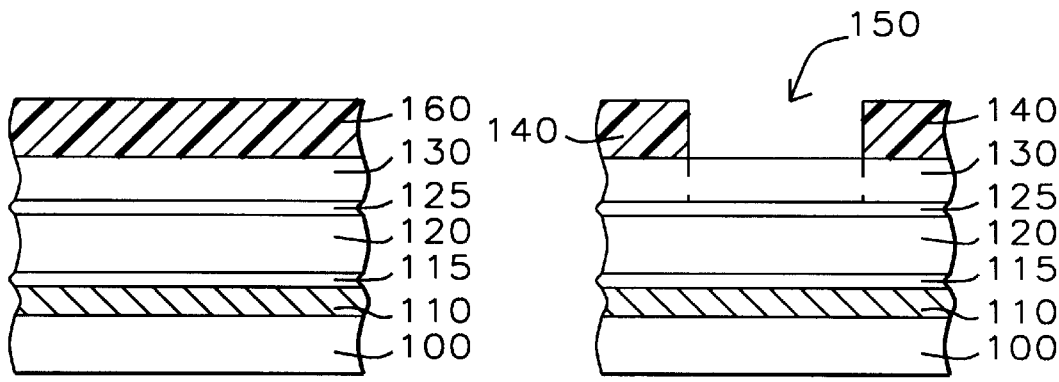
FIG. 1a - Prior Art
FIG. 1b - Prior Art
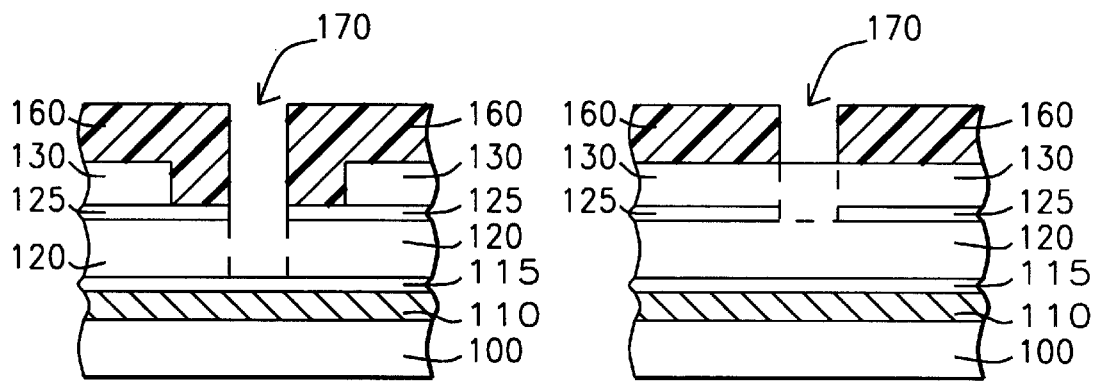
FIG. 1c - Prior Art
FIG. 1d - Prior Art FIG. 1e – Prior Art   FIG. 1f – Prior Art

METHOD TO REDUCE VIA POISON IN LOW-K CU DUAL DAMASCENE BY UV-TREATMENT

BACKGROUND OF THE INVENTION (1) Field of the Invention

The present invention relates to the manufacture of semiconductor devices in general, and in particular, to a method of reducing via poisoning in low-k copper dual damascene structures through ultraviolet treatment.

(2) Description of the Related Art

With the advent of ultra large scale integrated (ULSI) circuit technology, the number of interconnections required between millions of transistors have increased astronomically, as is well known to the practitioners in the art. These interconnections, in the form of metal lines, are usually are of very fine geometries and are closely spaced with respect to each other in order to conserve "real estate" in the chip on which they are formed. The planar area of the chip is further conserved by forming multi-level metallized layers separated from each other by insulative layers. The close spacing between the lines, both horizontally on the same layer, and vertically between layers, can cause higher electrical interference and cross-talk between the lines, and hence high resistance-capacitance (RC) delay for the circuitry. As the device geometries shrink further to less than 0.15 micrometers ($\mu$m), the RC delay becomes even more significant.

In order to decrease the RC delay, or, time constant, within these multi-level integrated systems, low-k (dielectric constant) insulative materials are used. Conventional semiconductor fabrication methods use silicon dioxide or similar insulative materials as both gap filler between adjacent conductor lines on the same layer and as an interlayer insulator between different layers of interconnections. Silicon dioxide has a dielectric constant of about 3.9, on a scale where 1.0 represents the dielectric constant of a vacuum. In the present manufacturing line, where materials such as black diamond, FLARE, SiLK are used in forming Cu dual damascene interconnects, low-k materials have a dielectric constant less than 3.0. However, low-k materials give rise to poisoned vias during the process of manufacturing copper dual damascene interconnects. The present invention discloses a method of preventing such poisoned vias.

Cu dual damascene is preferred as an interconnect because, as is well known in the art, copper has lower resistivity than the commonly used aluminum and, therefore contributes to lower RC delay. The damascene process also provides a better control of the metal line geometries, as described below, and therefore improves further the RC characteristics of the lines. However, if the damascene structure is not properly treated during forming of the contact and via holes, the holes can be "poisoned" due to outgassing from the insulative layers, and/or due to the hydrophobic nature of the insulative layers. A poisoned contact hole (reaching the substrate), or a poisoned via hole (connecting different metallized layers) can give rise to voids, cavities for contaminants to enter, poor interfaces between contacting conductors, and, hence, poor connections between interconnects. It is disclosed later in the embodiments of the present invention a method of treating Cu dual damascene structures in order to avoid the via poisoning problem.

Copper dual damascene process is a well-known technique for forming interconnections in semiconductor devices. It is especially well suited for Ultra Large Scale Integrated (ULSI) circuit technology where more and more devices are being packed into the same or smaller areas in a semiconductor substrate. As the feature sizes get smaller, the smaller geometries result in higher electrical resistances, which in turn degrade circuit performance. As will be described more fully later, damascene process provides a more exact dimensional control over small geometries, while copper, as the metallization material, provides better electrical characteristics.

The term 'damascene' is derived from a form of inlaid metal jewelry first seen in the city of Damascus. In the context of integrated circuits it implies a patterned layer imbedded on and in another layer such that the top surfaces of the two layers are coplanar. Thus, in semiconductor manufacturing, trenches and holes in appropriate locations in the trenches are formed in an insulative material by etching, which are then filled with metal. Metal in trenches form the horizontal metal line interconnects while the metal in the underlying holes form the vertical connections to the layers of metal interconnects formed in the previous damascene structure.

Thus, in a single damascene semiconductor manufacturing process, incisions, or trenches, are formed in an insulative layer and filled with metal to form conductive lines. Dual damascene takes the process one step further in that, in addition to forming the trenches of a single damascene, hole openings are also formed at appropriate places in the trench further into the insulative layer. The resulting composite structure of trenches and holes are filled with metal. The process is repeated as many times as required to form the multi-level interconnections between metal lines and the holes formed therebetween.

In one approach for a dual damascene process shown in FIG. 1a, two insulative layers (120) and (130) are formed on a substrate (100) with an intervening etch-stop layer (125). Substrate (100) is provided with metal layer (110) and a barrier layer (115). Metal layer can be the commonly used aluminum or copper, while the barrier can be an oxide layer. A desired trench or trench pattern (150) is first etched into the upper insulative material (130) using conventional photolithographic methods and photoresist (140). The etching stops on etch-stop layer (125). Next, a second photoresist layer (160) is formed over the substrate, thus filling the trench opening (150), and patterned with hole opening (170), as shown in FIG. 1c. The hole pattern is then etched into the lower insulative layer (120) as shown in FIG. 1c and photoresist removed, thus forming the dual damascene structure shown in FIG. 1f.

Or, the order in which the trench and the hole are formed can be reversed. Thus, the upper insulative layer (130) is first etched, or patterned, with hole (170), as shown in FIG. 1d. The hole pattern is also formed into etch-stop layer (125). Then, the upper layer is etched to form trench (150) while at the same time the etching transfers the hole pattern in the etch-stop layer into lower insulation layer (120), as shown in FIG. 1e. It will be noted that the etch-stop layer stops the etching of the trench into the lower insulation layer. After the completion of the thusly formed dual damascene structure, both the hole opening and trench opening are filled with metal (180), and any excess material on the surface of the substrate is removed by chemical mechanical polishing, as seen in FIG. 1f.

However, when trench (150), or hole (170) openings are formed through the insulative layers (120) and (130) as shown in FIGS. 1b–1e, moisture (190) is absorbed from the atmosphere by the exposed dielectric layers on the sidewalls of the openings. After copper (180) is deposited, moisture (190) is then released from the dielectric layers. This moisture diffuses into the metal causing poisoned via/contact metallurgy.

In prior art, various methods have been suggested to overcome the poisoned via problem. In U.S. Pat. No. 5,643,407, Chang teaches nitrogen plasma treatment after via etching. First, a thick insulative layer is formed over semiconductor device structures in and on a semiconductor substrate. A first metal layer is deposited over the thick insulative layer. The first metal layer is etched using conventional photolithography and etching techniques to form the desired metal pattern on the surface of the thick insulative layer. The intermetal dielectric layer is formed by first covering the patterned first metal layer with a layer of silicon oxide. The silicon oxide layer is covered with a layer of spin-on-glass material which is cured. A second layer of silicon oxide completes the intermetal dielectric layer. Via openings are formed through the intermetal dielectric layer to the underlying patterned first metal layer. A vacuum bake removes moisture from the exposed spin-on-glass layer within the via opening. A nitrogen plasma treatment converts the exposed spin-on-glass layer from an organic to an inorganic material The inorganic spin-on-glass material has less moisture absorption and suppresses outgassing from the rest of the organic spin-on-glass layer, thus preventing poisoned via metallurgy. A second metal layer is deposited overlying the intermetal dielectric layer and within the via openings and fabrication of the integrated circuit is completed.

Tran, et al., in U.S. Pat. No. 6,030,891 teach forming an electrical connection by filling a hole opening with hydrogen silsesquioxane (HSQ). However, vacuum baking is conducted before filling the through-hole to outgas water absorbed during solvent cleaning, thereby reducing void formation and improving via integrity.

Hwang, et al., also show, in U.S. Pat. No. 5,705,232, a method of in-situ coating, baking and curing dielectric materials, such as spin-on-glass, silicon dioxide and various other spin-on materials in fabricating semiconductors.

Khan, et al., on the other hand, disclose a method of modifying the surface topology of silicate films with electromagnetic radiation in the ultraviolet (UV) and/or vacuum ultraviolet (VUV) wavelengths. The surface smoothness of the resulting films are increased, which in turn help improve the filling abilities of the undoped silicate glass.

In another U.S. Pat. No. 5,970,384, Yamazaki , et al., teach forming silicon oxide films which are good as gate insulating films by subjecting silicon oxide films which have been formed on an active layer comprising a silicon film by means of a PVD method of CVD method to a heat treatment at 300–700° C. in an $N_2O$ atmosphere (or hydrogen nitride atmosphere) while irradiating with ultraviolet light, and then carrying out a heat treatment at 300–700° C. in a hydrogen nitride atmosphere ($N_2O$ atmosphere), and reducing the amount of hydrogen and carbon in the silicon oxide film and introducing nitrogen into the boundary with the silicon film in particular.

It is disclosed in the present invention a different method of utilizing UV treatment in forming Cu damascene interconnects, while avoiding the problem of via/contact hole poisoning.

SUMMARY OF THE INVENTION

It is therefore an object of this invention to provide a method of reducing via poison in low-k Cu dual damascene structures through an ultraviolet (UV) irradiation treatment.

It is another object of the present invention to provide a method of altering the surface characteristics of low-k materials in order to avoid deleterious chemical interactions with photoresist materials.

It is yet another object of the present invention to provide a method of reducing the RC delay of Cu dual damascene interconnects through UV treatment of the damascene structure.

These objects are accomplished by providing a substrate having a passivation layer formed over a first metal layer formed on said substrate; forming a first insulative layer over said substrate; forming an etch-stop layer over said first insulative layer; forming a second insulative layer over said etch-stop layer; forming a first photoresist layer over said second insulative layer and patterning said photoresist to form a first photoresist mask having a hole pattern; etching said first and second insulative layers, including said etch-stop layer through said hole pattern to form a hole reaching said passivation layer; removing said first photoresist mask; performing a first ultraviolet (UV) irradiation over said substrate, including said hole opening; forming a second photoresist layer over said substrate, including said hole opening and patterning said second photoresist to form a second photoresist mask having a trench pattern; etching said second insulative layer through said trench pattern in said second photoresist mask to form a trench in said second insulative layer, thus completing the forming of said dual damascene structure in said substrate; removing said second photoresist mask; performing a second ultraviolet (UV) irradiation over said substrate, including said trench and hole openings in said dual damascene structure; depositing a second metal in said dual damascene structure; and removing excess metal to complete the forming of the UV-irradiated dual damascene of the present invention.

BRIEF DESCRIPTION OF THE DRAWINGS

FIGS. 1a–1c show the forming of a dual damascene structure where a line trench or groove is etched first into an upper second dielectric layer until an etch-stop layer is reached, and then the hole pattern etched into the lower first dielectric layer, according to prior art.

FIGS. 1d–1e show the forming of a dual damascene structure where a hole pattern is etched first into an upper second dielectric layer until an etch-stop layer is reached, and then the line pattern etched into the top layer while at the same time the hole pattern is transferred into the lower first dielectric layer, according to prior art.

FIG. 1f shows a dual damascene structure formed by either one of the methods shown in FIGS. 1a–1c or FIGS. 1d–1e, according to prior art.

DESCRIPTION OF THE PREFERRED EMBODIMENTS

Referring now the drawings, FIGS. 2a–2f, there is shown a method of reducing via poison in low-k Cu dual damascene structures through an ultraviolet (UV)irradiation treatment.

Figure 2A:
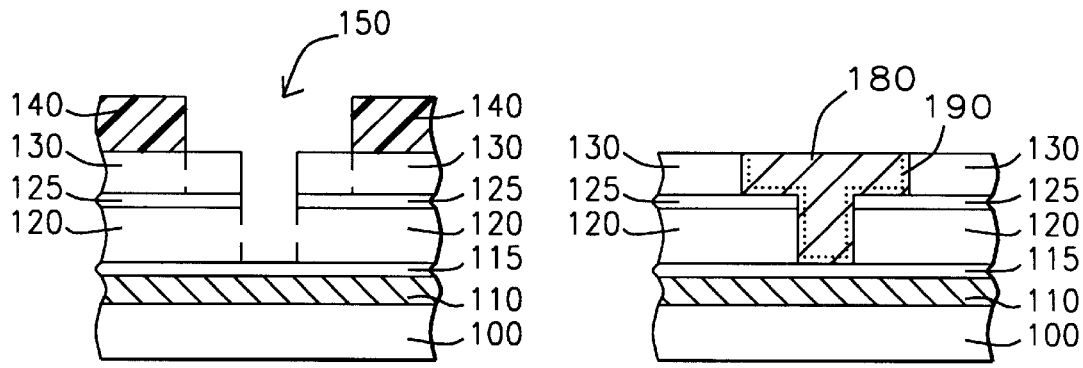
FIG. 2a is a partial cross-sectional view of a substrate showing the forming of a first photoresist mask over a passivation layer covering two underlying insulative layers separated from each other with an intervening etch-stop layer, according to the present invention.

Specifically, FIG. 2a shows a portion of a semiconductor substrate (200), which is preferably silicon. In FIG. 2a, the substrate is provided with a metal layer (210) and a passivation layer (215). Metal is preferably copper with a thickness between about 2000 to 12000 Å, and the passivation layer comprises oxide, nitride, carbide with a thickness between about 100 to 800 Å. It will be noted, however, that the presently disclosed method is applicable to forming a dual damascene interconnect to connect to either the substrate, that is, to form a contact, as is known in the art, or to connect to an underlying metal layer, to form a via. In other words, the method can be employed for forming either damascene contacts or vias.

First dielectric layer (220) is formed over the passivation layer, comprising a material of low dielectric constant (low-k). Some of the conventional low-k materials are usually fluorinated, such as the amorphous fluorinated carbon ($\alpha$-C:F), poly-tetra-fluoro-ethylene (PTFE), fluorinated polyimide, fluorinated or $SiO_2$, phosphosilicate glass (PSG). However, defluoriniation occurs with these materials, which then reacts with barrier materials and causes delamination. Barrier materials are used because, copper unfortunately suffers from high diffusivity in these insulating materials. For instance, copper tends to diffuse into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the component. Also, although these materials have relatively low dielectric constants of less than 4.0, it is preferred that even lower k materials, such as black diamond, FLARE, SILK having dielectric constants between about 2.5 to 2.9 be used. It is preferred that the first dielectric layer is formed by CVD or spinning on to a thickness between about 2500 to 12000 Å.

Next, an etch-stop, layer (225) shown in FIG. 2a is formed over the first dielectric layer. The etch-stop layer is preferably silicon nitride formed by reacting dichlorosilane ($SiCl_2H_2$), or silane ($SiH_4$), with ammonia ($NH_3$) in an LPCVD at a temperature between about 300 to 450° C. and to a thickness between about 100 to 800 Å. This is followed by the forming of second dielectric layer (230), which is also a low-k material chemical vapor deposited or spun on to a thickness between about 2500 to 12000 Å. A second passivation layer (235), same as the first passivation layer (215) as shown in FIG. 2a may also be formed over the second dielectric layer, but is not necessarily required.

Figure 2B:
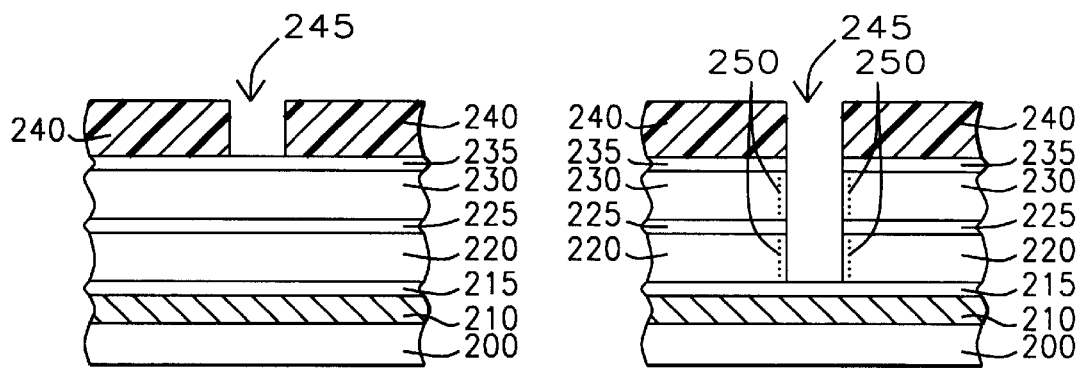
FIG. 2b is a partial cross-sectional view of a substrate showing the forming of a hole opening into the two insulative layers of FIG. 2a, according to the present invention.

Using conventional techniques, first photoresist layer (240) is next formed over the second insulative dielectric layer and then patterned to form a first photoresist mask with the image of a conventional via or a contact hole. Using the photoresist layer as a mask, hole pattern (245) is then etched into the second and first dielectric layers, in that order, including the intervening etch-stop layer (225) as shown in FIG. 2b. After the etching, the photoresist mask is removed, preferably by oxygen plasma ashing.

As it will be appreciated by those skilled in the art, etching process introduces moisture to the insulative layers (220) and (230) comprising the inside walls of the opening (245), as depicted by reference numeral (250) in FIG. 2b. This moisture then diffuses into the metal deposited in the opening at a later step. In other words, if not properly treated, the hole openings can be "poisoned" due to outgassing from the insulative layers during the subsequent step of metal deposition, and/or due to the hydrophobic nature of the insulative layers. A poisoned contact hole (reaching the substrate), or a poisoned via hole (connecting another metallized layer) can give rise to voids, cavities for contaminants to enter, poor interfaces between contacting conductors, and, hence, poor connections between interconnects. Also, it is found that low-k materials are susceptible to form interactions with photoresist material, and hence etching can leave behind photoresist residue, which are detrimental in forming poisoned contact/via holes.

Figures 2C, 2D:
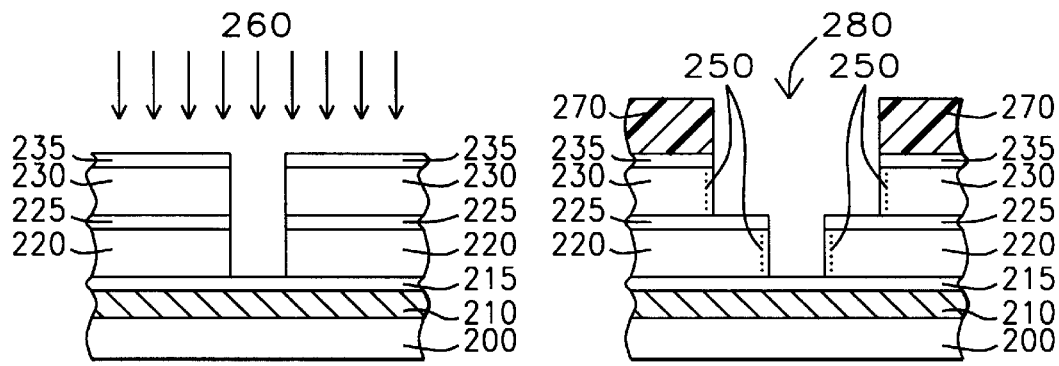
FIG. 2c is a partial cross-sectional view of a substrate showing the first ultraviolet (UV) treatment of the opening of FIG. 2b, according to the present invention.
FIG. 2d is a partial cross-sectional view of a substrate showing the forming of a second photoresist mask having a line trench pattern, and then the transferring of the trench pattern into the second insulative layer, according to the present invention.

After the removal of the first photoresist mask, it is, therefore, a main feature and key aspect of the present invention to subject the substrate, including the opening, to an appropriate treatment to avoid poisoned contact/vias. Preferably, this treatment comprises ultraviolet irradiation (260) performed at wavelength between about 150 to 600 nanometers (nm) and at a temperature between about 100 to 350° C. as shown in FIG. 2c. It is also preferred that the irradiation is performed in nitrogen or ozone rich environment.

Figures 2E, 2F:
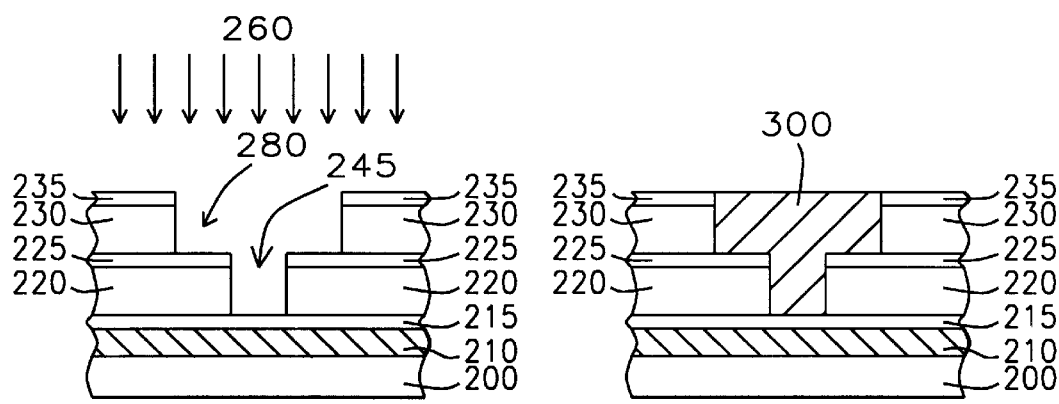
FIG. 2e is a partial cross-sectional view of a substrate showing the second ultraviolet (UV) treatment of the dual damascene structure of FIG. 2b, according to the present invention.
FIG. 2f is a partial cross-sectional view of a substrate showing the completion of the copper dual damascene interconnect of the present invention.

Next, second photoresist layer (270) is formed over the substrate, including the opening formed in the previous step, and patterned with the image of a line trench to form a second photoresist mask with a groove (280) as shown in FIG. 2d. The line pattern is next transferred from the second photoresist mask into the second dielectric layer by etching and stopping on etch-stop layer (225). After removal of the second photoresist layer, a damascene structure having a composite hole (245) and line (280) patter is thus formed as shown in FIG. 2e.

However, it will be noted that etching of the trench pattern will again subject the insulative layers to moisture-shown with reference numeral (250) in FIG. 2d- and also to the interaction between the second photoresist and the insulative layers. It is important, therefore, to subject the substrate, including the damascene structure to a second UV irradiation (260) as shown in FIG. 2e, preferably at a temperature between about 100 to 350° C.

A passivation layer (235) may then be formed over the damascene structure in order to provide a barrier prior to the forming of the next level of interconnect similar to the barrier layer (215) between the first metal layer (210) and damascene (245).

As a penultimate step, copper metal (300) is deposited in the dual damascene structure shown in FIG. 2f and subsequently, excess metal is removed by any number of conventional techniques, including chemical-mechanical polishing (CMP).

Thus, a Cu dual damascene interconnect is formed devoid of poisoned vias and/or contacts after having been subjected to a plurality of UV treatments. Though various details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite. For example, though the UV exposure method is applied to low-k materials here, the same method can be practiced when conventional insulative materials are also used.

While the invention has been particularly shown and described with reference to the preferred embodiments thereof, it will be understood by those skilled in the art that various changes in form and details may be made without departing from the spirit and scope of the invention.

What is claimed is:

1. A method to reduce via poison in low-k Cu dual damascene by UV-treatment comprising the steps of:

providing a substrate having a first and a second insulative layer separated from each other by an intervening etch-stop layer formed therein said substrate;

forming a hole opening in said first and second insulative layers, including said intervening etch-stop layer; then performing a first ultraviolet (UV) irradiation over said substrate, including said hole opening, at a wavelength between about 150 to 600 nanometers (nm);

forming a trench opening in said second insulative layer over said hole opening in said first insulative layer, thus completing the forming of said dual damascene structure in said substrate; then performing a second UV irradiation over said substrate, including said dual damascene structure, at a wavelength between about 150 to 600 nanometers (nm);

depositing metal in said dual damascene structure; and removing excess metal to complete the forming of the UV-irradiated dual damascene of the present invention.

2. The method of claim 1, wherein said substrate is silicon.

3. The method of claim 1, wherein said first insulative layer is a low-k dielectric having a dielectric constant between about 2.5 to 3.0.

4. The method of claim 1, wherein said first insulative layer has a thickness between about 2500 to 12000 Å.

5. The method of claim 1, wherein said intervening etch-stop layer is silicon nitride.

6. The method of claim 1, wherein said intervening etch-stop layer has a thickness between about 100 to 800 Å.

7. The method of claim 1, wherein said second insulative layer is a low-k dielectric having a dielectric constant between about 2.5 to 3.0.

8. The method of claim 1, wherein said second insulative layer has a thickness between about 2500 to 12000 Å.

9. The method of claim 1, wherein said first UV irradiation is accomplished at a temperature between about 100 to 350° C.

10. The method of claim 1, wherein said second UV irradiation is accomplished at a temperature between about 100 to 350° C.

11. The method of claim 1, wherein said metal comprises copper.

12. A method to reduce via poison in low-k Cu dual damascene by UV-treatment comprising the steps of:

providing a substrate having a passivation layer formed over a first metal layer formed on said substrate;

forming a first insulative layer over said substrate;

forming an etch-stop layer over said first insulative layer;

forming a second insulative layer over said etch-stop layer;

forming a first photoresist layer over said second insulative layer and patterning said photoresist to form a first photoresist mask having a hole pattern;

etching said first and second insulative layers, including said etch-stop layer through said hole pattern to form a hole reaching said passivation layer;

removing said first photoresist mask;

performing a first ultraviolet (UV) irradiation over said substrate, including said hole opening;

forming a second photoresist layer over said substrate, including said hole opening and patterning said second photoresist to form a second photoresist mask having a trench pattern;

etching said second insulative layer through said trench pattern in said second photoresist mask to form a trench in said second insulative layer, thus completing the forming of said dual damascene structure in said substrate;

removing said second photoresist mask;

performing a second ultraviolet (UV) irradiation over said substrate, including said trench and hole openings in said dual damascene structure;

depositing a second metal in said dual damascene structure; and removing excess metal to complete the forming of the UV-irradiated dual damascene of the present invention.

13. The method of claim 12, wherein said substrate is silicon.

14. The method of claim 12, wherein said first metal is copper.

15. The method of claim 12, wherein said first insulative layer is a low-k dielectric having a dielectric constant between about 2.5 to 3.0.

16. The method of claim 12, wherein said first insulative layer has a thickness between about 2500 to 12000 Å.

17. The method of claim 12, wherein said etch-stop layer is silicon nitride.

18. The method of claim 12, wherein said etch-stop layer has a thickness between about 100 to 800 Å.

19. The method of claim 12, wherein said second insulative layer is a low-k dielectric having a dielectric constant between about 2.5 to 3.0.

20. The method of claim 12, wherein said second insulative layer has a thickness between about 2500 to 12000 Å.

21. The method of claim 12, wherein said first UV irradiation is accomplished at a wavelength between about 150 to 600 nm and temperature between about 100 to 350° C.

22. The method of claim 12, wherein said second UV irradiation is accomplished at a wavelength between about 150 to 600 nm and temperature between about 100 to 350° C.

23. The method of claim 12, wherein said second metal comprises copper.

* * * * *